United States Patent
Chang et al.

(10) Patent No.: US 10,150,664 B2
(45) Date of Patent: Dec. 11, 2018

(54) MICROELECTROMECHANICAL SYSTEMS (MEMS) STOPPER STRUCTURE FOR STICTION IMPROVEMENT

(71) Applicant: Taiwan Semiconductor Manufacturing Co., Ltd., Hsin-Chu (TW)

(72) Inventors: Kai-Fung Chang, Taipei (TW); Lien-Yao Tsai, Hsinchu (TW); Len-Yi Leu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 9 days.

(21) Appl. No.: 14/570,282

(22) Filed: Dec. 15, 2014

(65) Prior Publication Data

US 2016/0167945 A1 Jun. 16, 2016

(51) Int. Cl.
*H01L 21/58* (2006.01)
*B81B 3/00* (2006.01)
*H01L 29/84* (2006.01)

(52) U.S. Cl.
CPC .............. *B81B 3/001* (2013.01); *H01L 29/84* (2013.01)

(58) Field of Classification Search
CPC ................................ H01L 21/58; H01L 29/84
See application file for complete search history.

(56) References Cited

U.S. PATENT DOCUMENTS

| | | | |
|---|---|---|---|
| 2007/0146095 A1* | 6/2007 | Chou | H01H 1/5822 333/105 |
| 2007/0268095 A1* | 11/2007 | Chou | H01P 1/127 333/262 |
| 2008/0194053 A1* | 8/2008 | Huang | B06B 1/0292 438/53 |
| 2009/0200620 A1* | 8/2009 | Omura | B81B 3/0021 257/419 |
| 2010/0002895 A1* | 1/2010 | Notake | B81B 3/0051 381/174 |
| 2011/0278684 A1* | 11/2011 | Kasai | G01H 11/06 257/416 |
| 2012/0261830 A1* | 10/2012 | Chu | B81C 1/00039 257/774 |
| 2013/0043510 A1* | 2/2013 | Shu | B81C 1/00269 257/254 |
| 2013/0075834 A1* | 3/2013 | Shu | H01L 29/84 257/415 |
| 2013/0167640 A1* | 7/2013 | Lim | G01P 15/0802 73/514.01 |

(Continued)

*Primary Examiner* — Joseph C Nicely
*Assistant Examiner* — Lamont Koo
(74) *Attorney, Agent, or Firm* — Eschweiler & Potashnik, LLC

(57) ABSTRACT

A microelectromechanical systems (MEMS) structure having a stopper integrated with a MEMS substrate is provided. A first substrate has a dielectric layer arranged over the first substrate. The dielectric layer includes a device opening. A second substrate is arranged over and bonded to the first substrate through the dielectric layer. The second substrate includes a deflectable element arranged over the device opening. A stopper is integrated with the second substrate and protrudes from the deflectable element over the device opening. A method for manufacturing the MEMS structure is also provided.

20 Claims, 12 Drawing Sheets

(56) References Cited

U.S. PATENT DOCUMENTS

2015/0001651 A1* 1/2015 Faralli .................. B81B 3/0021
  257/417
2015/0296305 A1* 10/2015 Shao .................... H04R 19/016
  381/174

* cited by examiner

MICROELECTROMECHANICAL SYSTEMS (MEMS) STOPPER STRUCTURE FOR STICTION IMPROVEMENT

BACKGROUND

Microelectromechanical systems (MEMS) devices, such as accelerometers, pressure sensors, and microphones, have found widespread use in many modern day electronic devices. For example, MEMS accelerometers are commonly found in automobiles (e.g., in airbag deployment systems), tablet computers, or in smart phones. For many applications, MEMS devices are electrically connected to application-specific integrated circuits (ASICs) to form complete MEMS systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
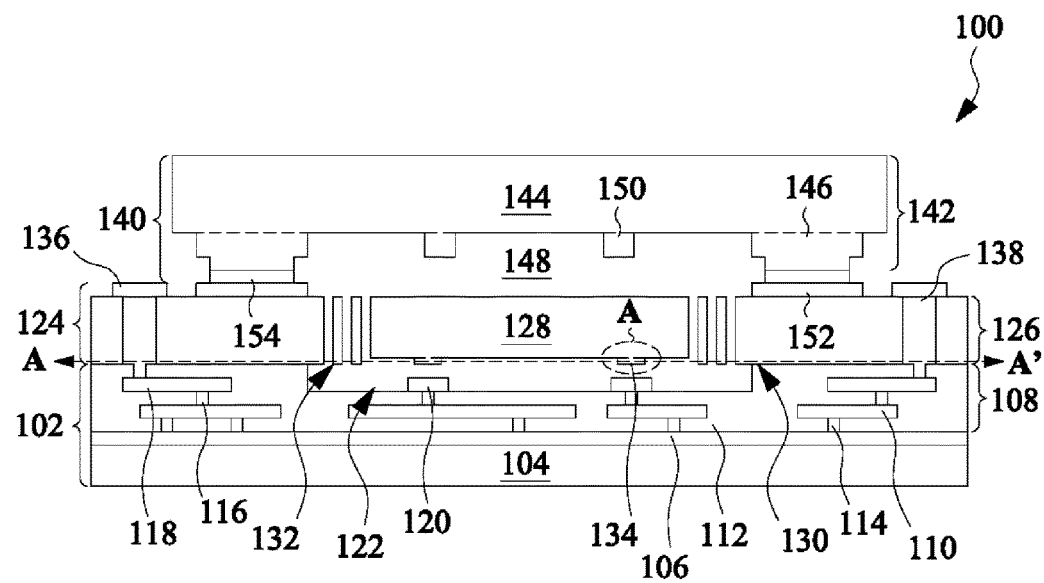
FIG. 1A illustrates a cross-sectional view of some embodiments of a microelectromechanical systems (MEMS) structure including stoppers integrated with a MEMS substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Some microelectromechanical systems (MEMS) devices include a deflectable element arranged over an opening in an interlayer dielectric (ILD). For motion sensing MEMS devices, the deflectable element is commonly referred to as a proof mass, and for pressure sensing MEMS devices, the movable element is commonly referred to as a flexible membrane. In operation, the deflectable element deflects in proportion to external stimuli, such as motion or pressure, whereby the external stimuli can be quantified by measuring the deflection.

A challenge with the foregoing MEMS devices pertains to stiction, such as charge induced stiction and Van Waals stiction. When deflecting along the Z-axis (i.e., in the vertical direction), the deflectable element can "stick" to the bottom of the opening, thereby inhibiting proper operation of the MEMS device. To address this challenge, stoppers are often placed along the bottom of the opening. The stoppers protrude from the bottom of the opening and stop the deflectable element from interfacing with the bottom of the opening. Because the stoppers have a reduced surface area, relative to the bottom of the opening, the likelihood of stiction between the stoppers and the deflectable element is substantially less than between the bottom of the opening and the deflectable element.

Stoppers are often formed from oxide and/or metal. According to one stopper design, oxide stoppers protrude from the bottom of the opening towards the deflectable element. However, these stoppers are easily broken upon impact from the deflectable element. According to another stopper design, hybrid metal and oxide stoppers protrude from the bottom of the opening towards the deflectable element and include oxide arranged over metal. However, these stoppers suffer from particle defection (i.e., movement) in that the oxide often sinks into the metal, thereby reducing the effectiveness of the stoppers.

In view of the foregoing, the present disclosure is directed to a MEMS structure having improved stoppers. The MEMS structure includes an ILD layer arranged vertically between a first substrate and a second substrate. The ILD layer includes an opening over which a deflectable element is arranged. The deflectable element is integrated into the second substrate and corresponds to, for example, a proof mass. The improved stoppers protrude from the deflectable element vertically towards the first substrate, and are integrated with the second substrate. By integrating the improved stoppers with the second substrate and/or forming the improved stoppers from silicon, the reliability and the strength of the stoppers are advantageously improved compared to conventional stoppers. Even more, the likelihood of stiction is advantageously reduced compared to conventional stoppers since silicon, for example, has a lower adhesion rate than oxide or metal. The present disclosure is also directed to a method for manufacturing the MEMS structure. Advantageously, the method is simplified compared to conventional processes since the process does not call for any oxide or metal depositions. Therefore, costs are reduced.

With reference to FIG. 1A, cross-sectional view 100 of some embodiments of a MEMS structure is provided. The MEMS structure comprises an IC 102 that supports MEMS operations and is, for example, an application-specific-integrated circuit (ASIC). The IC 102 includes an IC substrate 104 over and/or within which a device layer 106 is arranged. The IC substrate 104 is, for example, a bulk semiconductor substrate of silicon or a semiconductor-on-insulator (SOI) substrate. The device layer 106 includes electronic components, such as, for example, one or more of transistors, capacitors, resistors, inductors, and diodes.

A back-end-of-line (BEOL) stack 108 of the IC 102 is arranged over the device layer 106 of the IC 102. The BEOL stack 108 interconnects the electronics components of the device layer 106. One or more metallization layers 110 of the BEOL stack 108 are arranged within an interlayer dielectric (ILD) layer 112 of the BEOL stack 108, and one or more contacts 114 of the BEOL stack 108 electrically couple the device layer 106 to the metallization layers 110. Further, one or more IC vias 116 of the BEOL stack 108 electrically couple the metallization layers 110 to IC bond pads 118 of the BEOL stack 108 and to one or more sensing electrodes 120 of the BEOL stack 108. The IC bond pads 118 are laterally spaced around an IC opening 122 in the ILD layer 112, and the sensing electrodes 120 are arranged in the IC opening 122 between the IC bond pads 118. The sensing electrodes 120 are electrically coupled to the metallization layers 110 (out of the illustrated view) and, in some embodiments, include a star-shaped sensing electrode. The metallization layers 110, the contacts 114, the IC vias 116, the IC bond pads 118, and the sensing electrodes 120 are conductive and are or otherwise include, for example, one or more copper, aluminum, aluminum copper, tungsten, or another metal. The ILD layer 112 is or otherwise includes, for example, a low-κ dielectric (i.e., a dielectric with a dielectric constant κ less than 3.9), or silicon dioxide.

A MEMS device 124 is arranged over the IC 102. The MEMS device 124 corresponds to, for example, a motion sensor, a pressure sensor, or a microphone. The MEMS device 124 includes a MEMS substrate 126 arranged over and bonded to the IC substrate 104 through the ILD layer 112. The ILD layer 112 provides spacing between the MEMS substrate 126 and the IC substrate 104, and facilitates bonding of the MEMS substrate 126 to the IC substrate 104, typically by a fusion bond. The MEMS substrate 126 is, for example, a bulk semiconductor substrate, an SOI substrate, or a polysilicon-on-insulator (POI) substrate. The bulk semiconductor substrate is typically a bulk silicon substrate, but it can also be or otherwise include other materials, such as germanium, silicon carbide, a group III element, a group IV element, or the like.

A deflectable element 128 of the MEMS device 124 is integrated into the MEMS substrate 126 over the IC opening 122, and an anchor 130 of the MEMS device 124 is integrated into the MEMS substrate 126 around the periphery of the IC opening 122 to support the deflectable element 128. Where the MEMS device 124 corresponds to a motion sensor or a microphone, the deflectable element 128 is often referred to as a proof mass, and where the MEMS device 124 corresponds to a pressure sensor, the deflectable element 128 is often referred to as a flexible membrane. In some embodiments, the deflectable element 128 is electrically coupled to the IC substrate 104 and serves as an electrode. Further, in some embodiments, such as where the MEMS device 124 is a motion sensor or a microphone, the MEMS device 124 further includes one or more springs 132 integrated into the MEMS substrate 126 and suspending the deflectable element 128 over the IC opening 122.

In operation, the deflectable element 128 deflects in proportion to external stimuli, such as motion, sound waves or pressure, whereby the external stimuli can be quantified by measuring the deflection. For example, where the MEMS device 124 is a pressure sensor, the deflectable element 128 can seal the IC opening 122 with a reference pressure. The deflectable element 128 thereafter deflects in proportion to the deviation between the reference pressure and an environmental pressure on an opposite side of the deflectable element 128 as the reference pressure. As another example, where the MEMS device 124 is a motion sensor or microphone, the deflectable element 128 deflects in proportion to motion applied to the MEMS device 124 or sounds waves hitting the deflectable element 128. Regardless of the mechanism by which the deflectable element 128 deflects, the sensing electrodes 120 cooperate with the deflectable element 128 to quantify the deflection using capacitive coupling therebetween.

MEMS stoppers 134 of the MEMS device 124 are integrated within the MEMS substrate 126 protruding from the deflectable element 128 towards the IC substrate 104 over the IC opening 122. The MEMS stoppers 134 stop the deflectable element 128 from overextending in the vertical direction towards the IC substrate 104. This advantageously reduces the likelihood of damage to the MEMS device 124 and increases the useful life of the MEMS device 124. Further, the MEMS stoppers 134 reduce stiction, such as Vander Waals induced stiction or charge induced stiction, between the ILD layer 112 and the deflectable element 128.

The MEMS stoppers 134 may be a same material as the deflectable element 128. For example, in some embodiments, the MEMS stoppers 134 and the deflectable element 128 may comprise silicon. In other embodiments, the MEMS stoppers 134 and the deflectable element 128 are a continuous piece of silicon. By forming the MEMS stoppers 134 from silicon, the reliability and the strength of the MEMS stoppers 134 are advantageously improved compared to conventional stoppers. Additionally, stiction between the MEMS stoppers 134 and the ILD layer 112 is also reduced since silicon has a low degree of stiction.

Figure 1B:
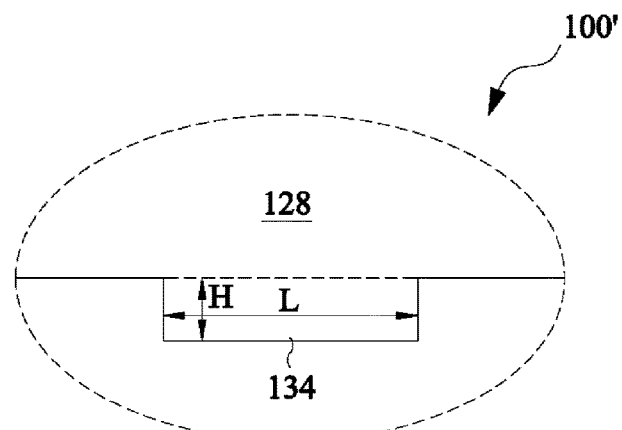
FIG. 1B illustrates an enlarged cross-sectional view of some embodiments of an integrated stopper of FIG. 1A.

With reference to FIG. 1B, an enlarged cross-sectional view within ellipse A of FIG. 1A is provided. As illustrated, a height H of the MEMS stoppers 134 extends between opposing top and bottom surfaces, and a length L of the MEMS stoppers 134 extends between opposing sidewalls. In some embodiments, the height H is between about one of 0.1-10 micrometers and 11-100 micrometers. Further, in some embodiments, the length L is between about one of 0.1-10 micrometers, 11-100 micrometers, 100-500 micrometers, and 501-1000 micrometers.

Referring back to FIG. 1A, MEMS bond pads 136 of the MEMS device 124 are arranged over the MEMS substrate 126 and are electrically coupled to the IC bond pads 118 to provide an interface to the IC 102 from over the MEMS substrate 126. The MEMS bond pads 136 are electrically coupled to the IC bond pads 118 by through silicon vias (TSVs) 138 extending through the MEMS substrate 126, into the ILD layer 112, to the IC bond pads 118. In some embodiments, the footprints of the TSVs 138 discretely taper towards the IC substrate 104. The TSVs 138 may comprise polysilicon or metal, such as tungsten, copper, or aluminum. The MEMS bond pads 136 are or otherwise include, for example, metal, such as aluminum copper.

A cap device 140 is arranged over the MEMS device 124 and includes a cap substrate 142 arranged over and bonded to the MEMS substrate 126. The cap substrate 142 includes a base region 144 having a generally uniform thickness and a mounting region 146 extending vertically from the base region 144 around a cap opening 148. In some embodiments, the footprints of the mounting region 146 discretely taper towards the MEMS substrate 126. Further, in some embodiments, the cap substrate 142 further includes cap stoppers 150. The cap stoppers 150 are arranged over the deflectable element 128 and protrude from the base region 144 towards the deflectable element 128. The cap stoppers 150 stop the deflectable element 128 from overextending in the vertical direction towards the base region 144, and reduce stiction between the base region 144 and the deflectable element 128. The cap substrate 142 may be, for example, a bulk semiconductor substrate or an SOI substrate.

A MEMS eutectic bonding ring 152 of the MEMS device 124 and a cap eutectic bonding ring 154 of the cap device 140 bond the cap substrate 142 to the MEMS substrate 126. The MEMS eutectic bonding ring 152 is arranged on a top surface of the MEMS substrate 126 around the periphery of the IC opening 122, and a cap eutectic bonding ring 154 is arranged on a bottom surface of the mounting region 146 of the cap substrate 142 around the periphery of the cap opening 148. The MEMS and cap eutectic bonding rings 152, 154 have substantially the same footprints and interface to define a eutectic bond at the interface therebetween. The MEMS eutectic bonding ring 152 is or otherwise includes, for example, aluminum copper, and the cap eutectic bonding ring 154 is or otherwise includes, for example, germanium.

Typically, as illustrated, the MEMS stoppers 134 are arranged over and vertically aligned with the sensing electrodes 120. However, in other embodiments, as shown by a cross-sectional view 200 of FIG. 2, the sensing electrodes 120 are laterally spaced between the MEMS stoppers 134. Alternatively, in yet other embodiments, as shown by a cross-sectional view 300 of FIG. 3, the MEMS stoppers 134 are laterally spaced between the sensing electrodes 120.

Figure 4A:
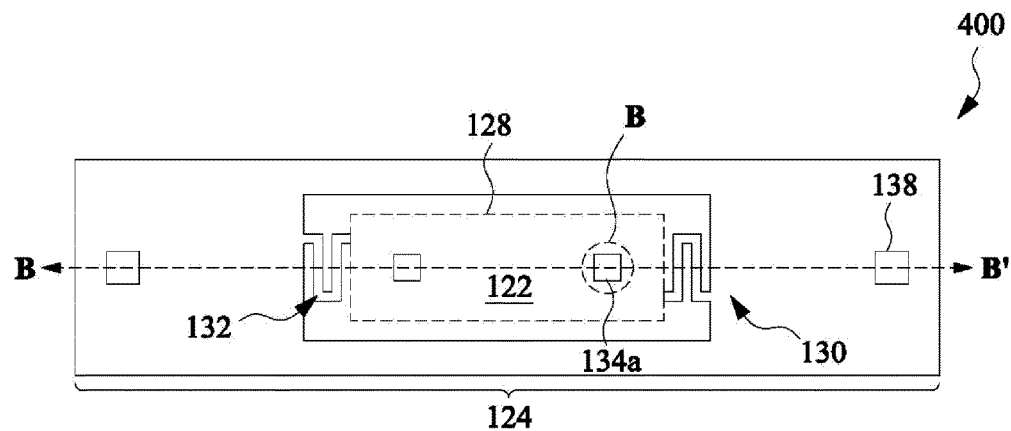
FIG. 4A illustrates a top view of some embodiments of a MEMS structure including stoppers integrated with a MEMS substrate.
Figure 4B:
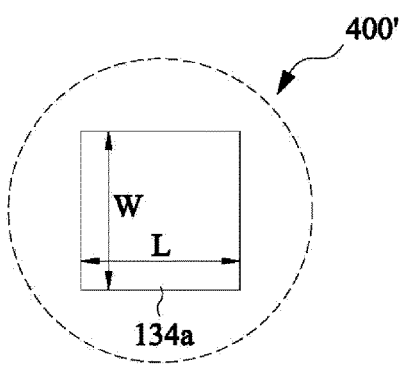
FIG. 4B illustrates an enlarged top view of some embodiments of an integrated stopper of FIG. 4A.
Figure 5A:
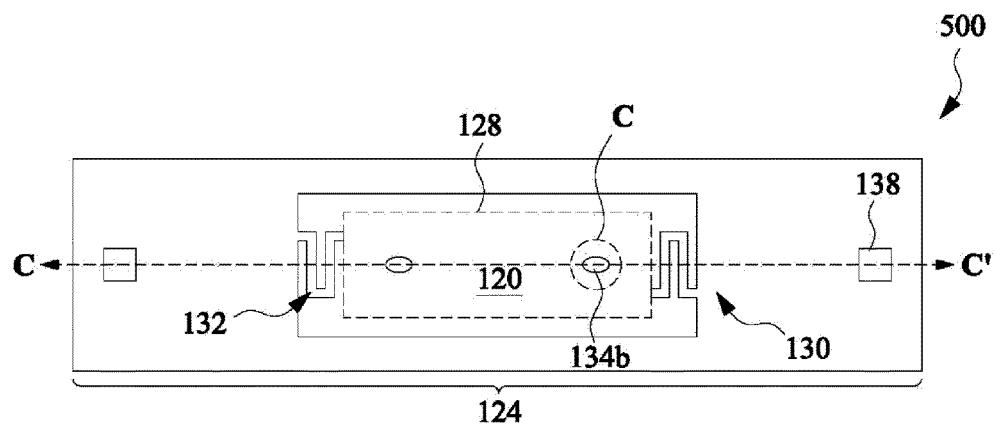
FIG. 5A illustrates a top view of other embodiments of a MEMS structure including stoppers integrated with a MEMS substrate.
Figure 5B:
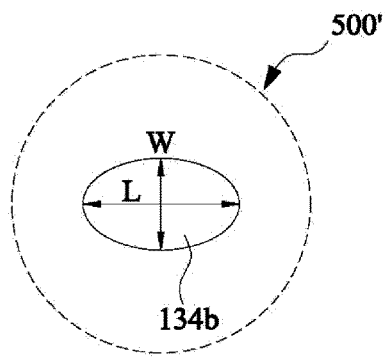
FIG. 5B illustrates an enlarged top view of some embodiments of an integrated stopper of FIG. 5A.

With reference to FIGS. 4A & B and 5A & B, top views 400, 400', 500, 500' of different embodiments of the MEMS structure taken along line A-A' of FIG. 1A are provided, where FIG. 1A is taken along line B-B' of FIG. 4A and line C-C' of FIG. 5A. FIGS. 4B and 5B are enlarged top views 400', 500' corresponding to circles B and C of FIGS. 4A and 5A.

As illustrated, a width W of the MEMS stoppers 134a 134b extends between opposing sidewalls and perpendicular to the length L. In some embodiments, the width W is between about one of 0.1-10 micrometers, 11-100 micrometers, 100-500 micrometers, and 501-1000 micrometers. Further, in some embodiments, the ratio of the length L to the width W (i.e., L/R) is between about one of 0.0001-0.01, 0.01-1, 1-100 and 100-10000. A footprint of the MEMS stoppers 134a 134b extends along the length L and the width W (i.e., extends in the plane defined along the length L and the width W). The footprint can take on any shape. In some embodiments, as shown by FIGS. 4A & B, the footprint of the MEMS stopper 134a is rectangular or square shaped. Alternatively, in other embodiments, as shown by FIGS. 5A & B, the footprint of the MEMS substrate 134b is circular or elliptical. In yet other embodiments, not shown, the footprint can be triangular, trapezoidal, ring-shaped, etc.

The MEMS stoppers 134, by being integrated with the MEMS substrate 126 and/or formed from silicon, are often more reliable and stronger than conventional stoppers formed from oxide and/or metal. For example, the MEMS stoppers 134 are less likely to break than oxide stoppers. As another example, particles of the MEMS stoppers 134 do not defect or move within the MEMS stoppers 134 since the MEMS stoppers 134 are typically homogeneous, whereas the oxide in hybrid metal and oxide stoppers often sinks into the metal. Further, the MEMS stoppers 134 often reduce stiction better than conventional stoppers formed from oxide and/or metal, due to lower adhesion (e.g., silicon has lower adhesion than silicon dioxide). Because of the increased strength of the MEMS stoppers 134, the size of the MEMS stoppers 134 can be reduced, and/or the shape selected, to reduce the surface area of the MEMS stoppers 134 interfacing with the ILD layer 112.

Figure 6:
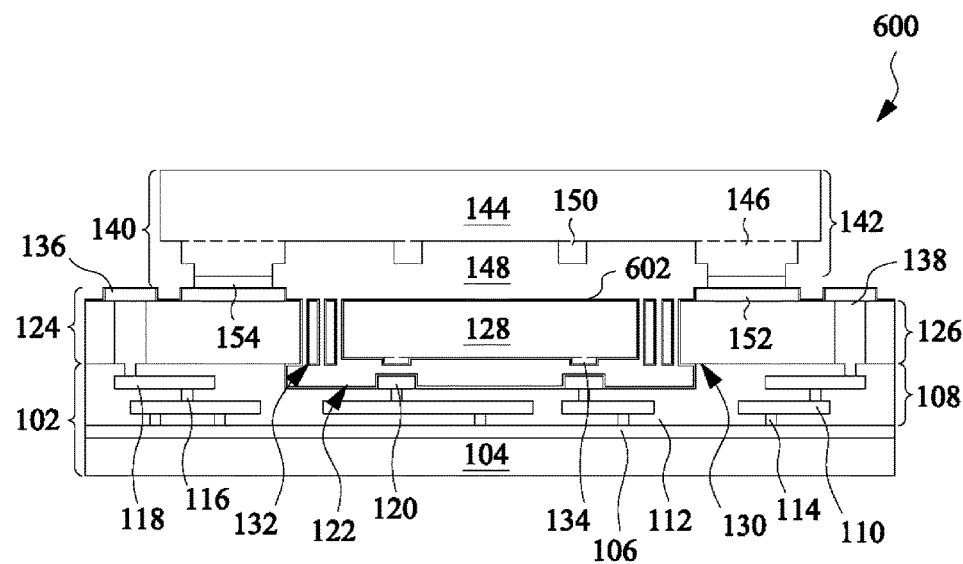
FIG. 6 illustrates a cross-sectional view of some embodiments of a MEMS structure including stoppers integrated with a MEMS substrate and an anti-stiction layer.

With reference to FIG. 6, a cross-sectional view 600 of alternative embodiments of the MEMS structure of FIG. 1 are provided. The alternative embodiments include an anti-stiction layer 602 lining the MEMS substrate 126, the ILD layer 112, the sensing electrodes 120, the MEMS stoppers 134, the MEMS bond pads 136, and the MEMS eutectic bonding ring 152. The anti-stiction layer 602 further reduces stiction, such as charge induced stiction and Van Waals stiction, between the ILD layer 112 and the MEMS stoppers 134. Typically, the anti-stiction layer 602 is a self-assembled monolayer (SAM).

Figure 2:
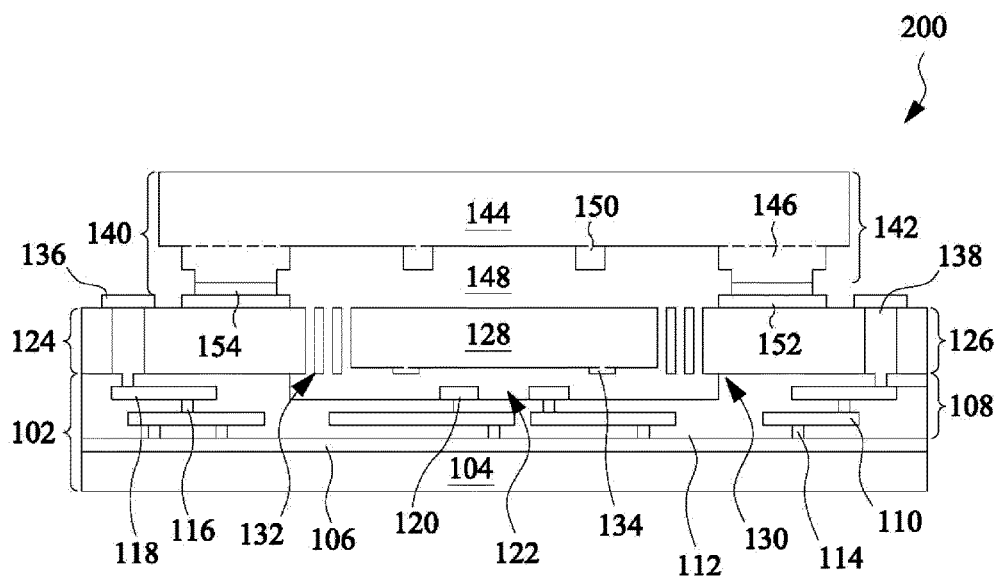
FIG. 2 illustrates a cross-sectional view of other embodiments of a MEMS structure including stoppers integrated with a MEMS substrate.
Figure 3:
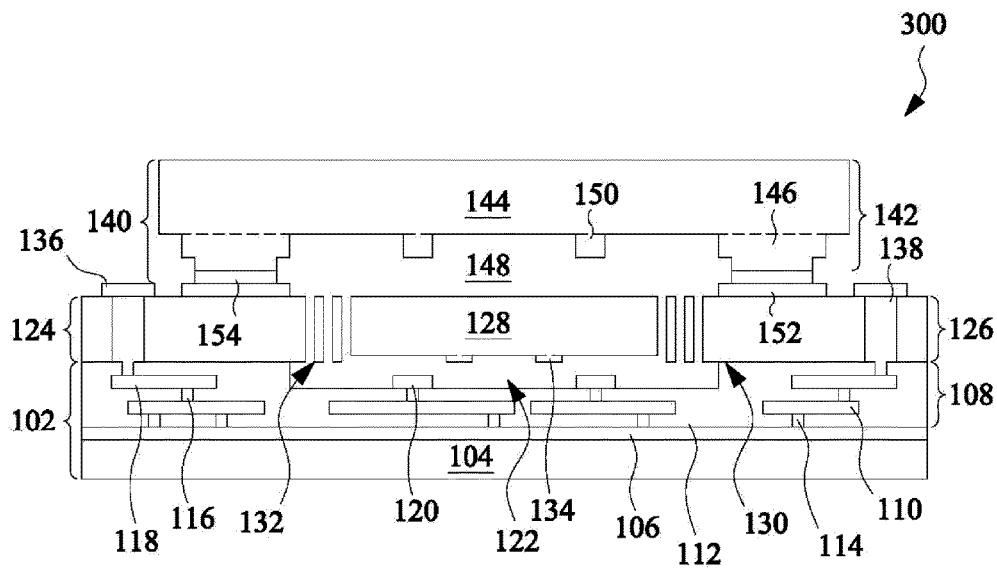
FIG. 3 illustrates a cross-sectional view of yet other embodiments of a MEMS structure including stoppers integrated with a MEMS substrate.
Figure 7:
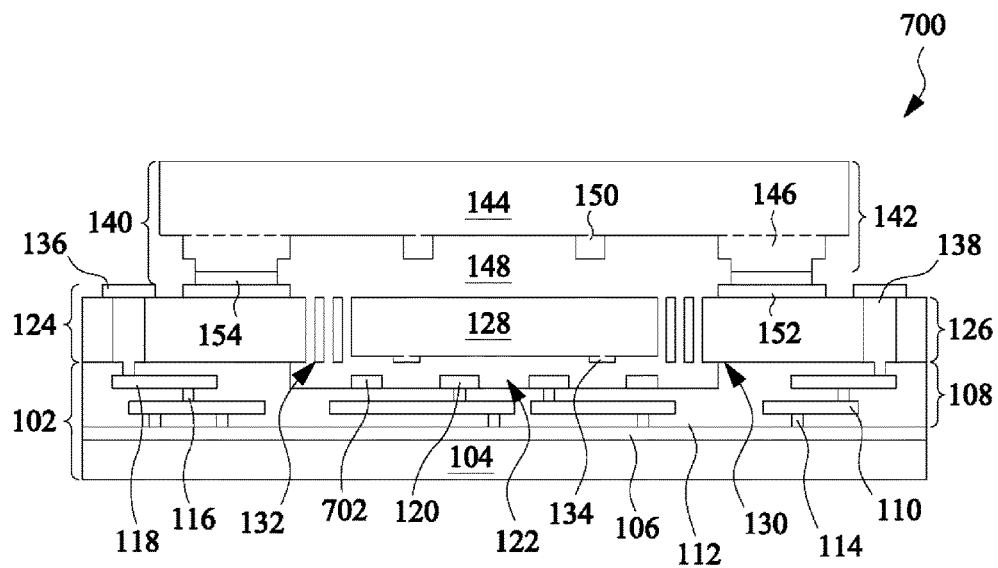
FIG. 7 illustrates a cross-sectional view of some embodiments of a MEMS structure including stoppers of an integrated circuit (IC) and stoppers integrated with a MEMS substrate.
Figure 8:
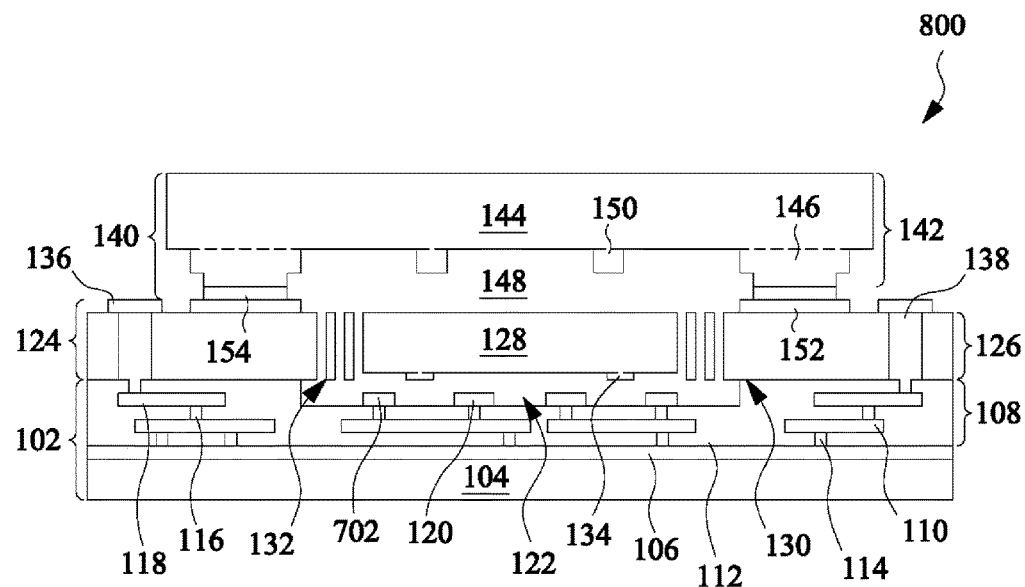
FIG. 8 illustrates a cross-sectional view of alternative embodiments of a MEMS structure including stoppers of an IC and stoppers integrated with a MEMS substrate.

With reference to FIGS. 7 and 8, cross-sectional views 700, 800 of alternative embodiments of the MEMS structure of FIG. 2 are provided. The alternative embodiments include one or more IC stoppers 702 arranged in the IC opening 122 outside the sensing electrodes 120 and the MEMS stoppers 134. The IC stoppers 702 provide additional support for stopping the deflectable element 128, and therefore reduce the likelihood of damage to the deflectable element 128. As illustrated by FIG. 7, the IC stoppers 702 are typically electrically independent of the metallization layers 110. However, as illustrated by FIG. 8, the IC stoppers 702 can be electrically coupled to the metallization layers 110 using the IC vias 116. Where the IC stoppers 702 are electrically coupled to the metallization layers, the IC stoppers 702 can, for example, used with the sensing electrodes 120 to sense deflection of the deflectable element 128. In some embodiments, the IC stoppers 702 include a star-shaped IC stopper. The IC stoppers 702 are or otherwise include, for example, one or more of copper, aluminum, aluminum copper, tungsten, gold, silver or another metal.

Figure 9:
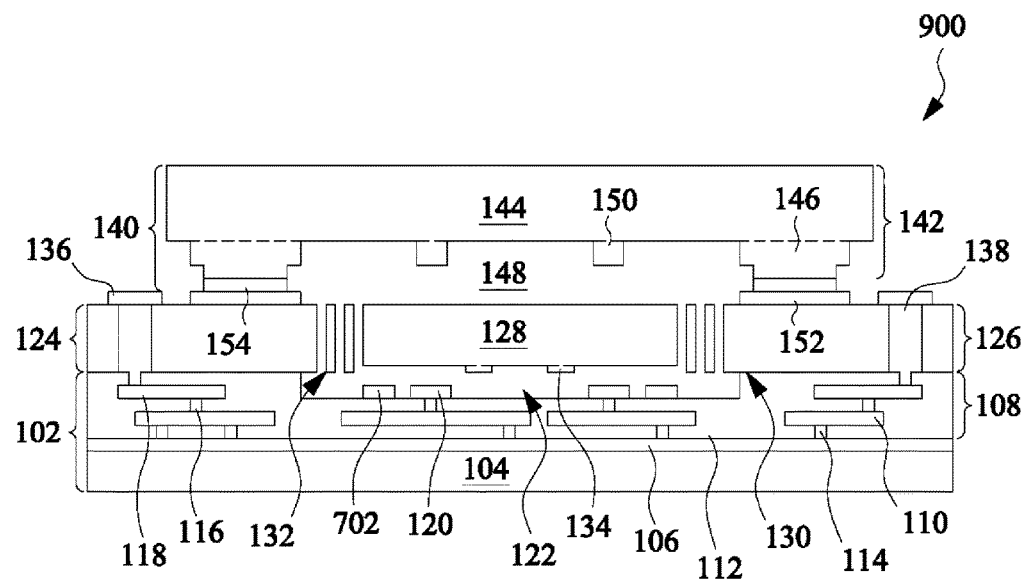
FIG. 9 illustrates a cross-sectional view of other alternative embodiments of a MEMS structure including stoppers of an IC and stoppers integrated with a MEMS substrate.
Figure 10:
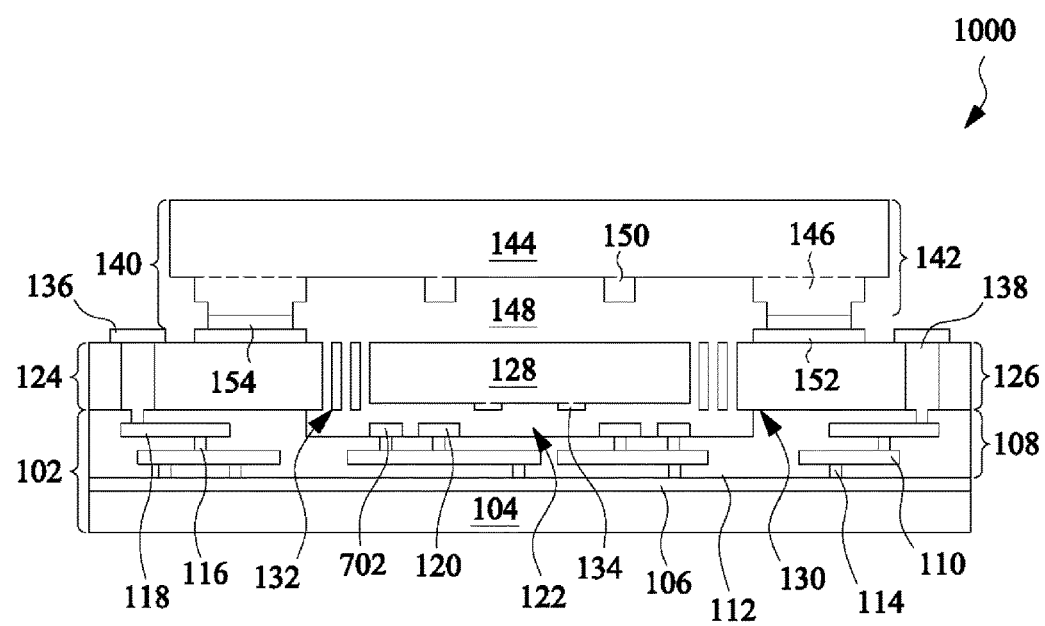
FIG. 10 illustrates a cross-sectional view of yet other alternative embodiments of a MEMS structure including stoppers of an IC and stoppers integrated with a MEMS substrate.

While IC stoppers 702 are illustrated with embodiments of the MEMS structure corresponding to FIG. 2, it is to be appreciated that the IC stoppers 702 can be applied to other embodiments, such as the embodiments of FIGS. 1A & B and 3. For example, cross-sectional views 900, 1000 of FIGS. 9 and 10 illustrate application of the IC stoppers 702 to the MEMS structure corresponding to FIG. 3. FIG. 9 illustrates the IC stoppers 702 electrically independent of the metallization layers 110, and FIG. 10 illustrates the IC stoppers 702 electrically coupled to the metallization layers 110.

Figure 11:
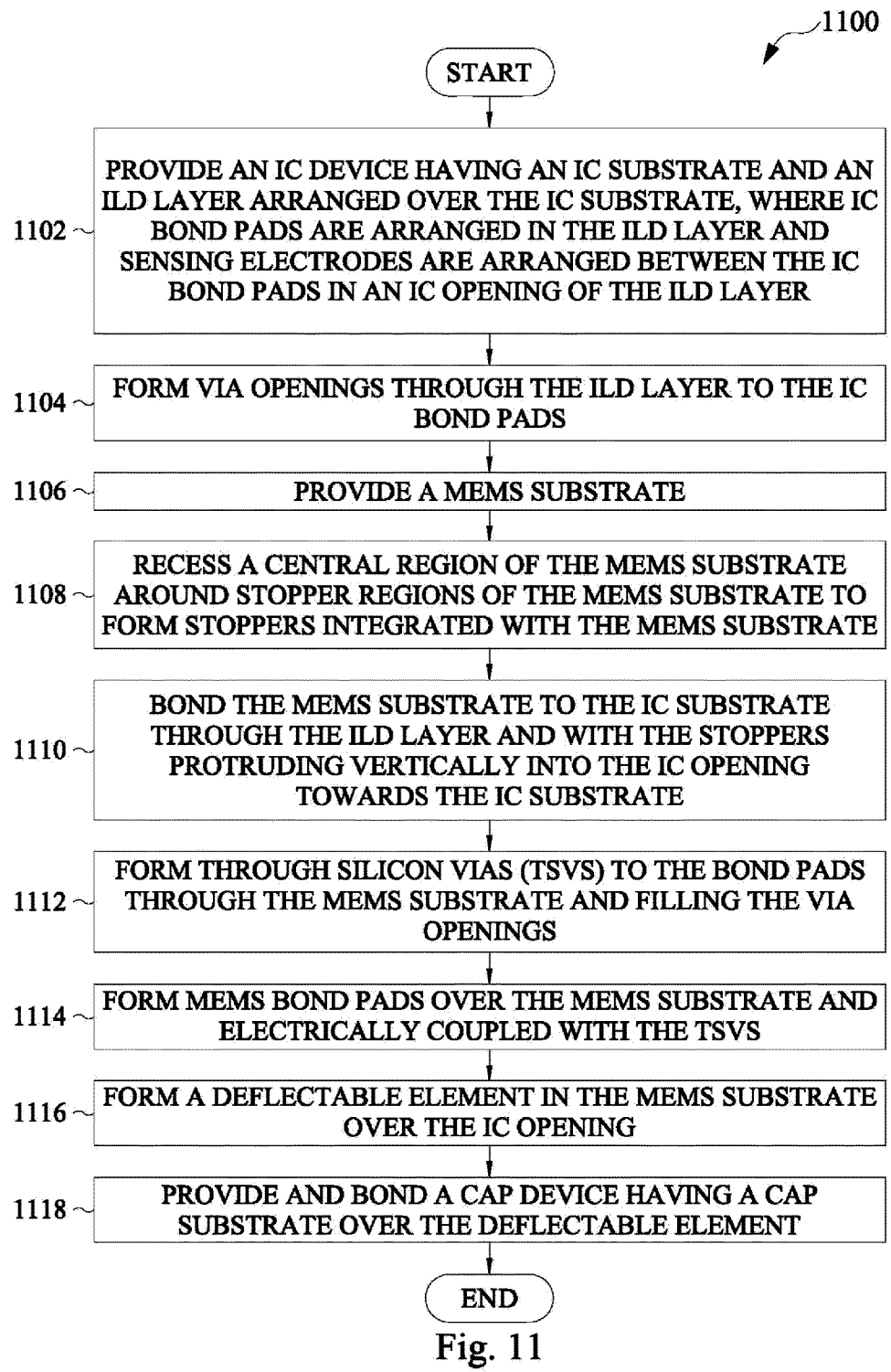
FIG. 11 illustrates a flow chart of some embodiments of a method for manufacturing a MEMS structure having stoppers integrated with a MEMS substrate.

With reference to FIG. 11, a flowchart 1100 provides some embodiments of a method for manufacturing a MEMS structure with integrated stoppers.

At 1102, an IC device having an IC substrate and an ILD layer arranged over the IC substrate are provided. IC bond pads are arranged in the ILD layer and sensing electrodes are arranged between the IC bond pads in an IC opening of the ILD layer.

At 1104, via openings are formed through the ILD layer to the IC bond pads.

At 1106, a MEMS substrate is provided.

At 1108, a central region of the MEMS substrate is recessed around stopper regions of the MEMS substrate to form stoppers integrated with the MEMS substrate. Advantageously, the stoppers ease the process for manufacturing stoppers, and thereby reduce costs. For example, instead of having to deposit oxide and/or metal layers, and subsequently having to etch the layers, an etch is performed into the MEMS substrate.

At 1110, the MEMS substrate is bonded to the IC substrate through the ILD layer and with the stoppers protruding vertically into the IC opening towards the IC substrate.

At 1112, via openings are formed and subsequently filled with a conductive material to form TSVs that extend to the bond pads through the MEMS substrate.

At 1114, MEMS bond pads are formed over the MEMS substrate and electrically coupled with the TSVs.

At 1116, a deflectable element is formed in the MEMS substrate over the IC opening.

At 1118, a cap device having a cap substrate is provided and bonded over the deflectable element.

While the disclosed methods (e.g., the method described by the flowchart 1100) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 12-23, cross-sectional views of some embodiments of a MEMS structure at various stages of manufacture are provided to illustrate the method of FIG. 11. Although FIGS. 12-23 are described in relation to the method, it will be appreciated that the structures disclosed in FIGS. 12-23 are not limited to the method, but instead may stand alone as structures independent of the method. Similarly, although the method is described in relation to FIGS. 12-23, it will be appreciated that the method is not limited to the structures disclosed in FIGS. 12-23, but instead may stand alone independent of the structures disclosed in FIGS. 12-23.

Figure 12:
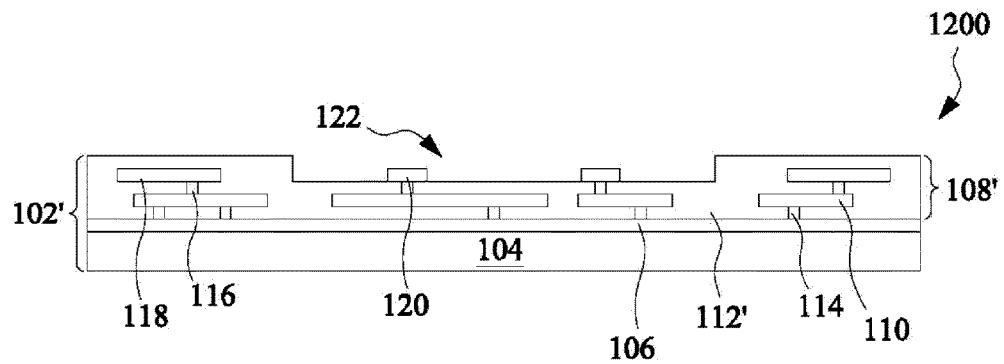
FIGS. 12-23 illustrate a series of cross-sectional views of some embodiments of a MEMS structure at various stages of manufacture, the MEMS structure including stoppers integrated with a MEMS substrate.

FIG. 12 illustrates a cross-sectional view 1200 of some embodiments corresponding to 1102 of FIG. 11.

As shown by FIG. 12, an IC 102' is provided. The IC 102' supports MEMS operations and is, for example, formed according to conventional complementary metal-oxide-semiconductor (CMOS) manufacturing processes. The IC 102' includes an IC substrate 104 over and/or within which a device layer 106 is arranged. In some embodiments, the IC substrate 104 is a bulk semiconductor substrate including one or more of silicon, germanium, a group III element, and a group V element. In alternative embodiments, the IC substrate 104 is an SOI substrate or a POI substrate. The device layer 106 includes electronic components, such as resistors, transistors, etc.

A BEOL stack 108' is arranged over the device layer 106. One or more metallization layers 110 of the BEOL stack 108' are arranged within an ILD layer 112' of the BEOL stack 108', and one or more contacts 114 of the BEOL stack 108' electrically couple the device layer 106 to the metallization layers 110. Further, one or more IC vias 116 of the BEOL stack 108' electrically couple the metallization layers 110 to IC bond pads 118 of the BEOL stack 108' and sensing electrodes 120 of the BEOL stack 108'. The IC bond pads 118 are laterally spaced around an IC opening 122 in the ILD layer 112', and the sensing electrodes 120 are arranged in the IC opening. 122

In some embodiments, one or more IC stoppers (not shown) are arranged in the IC opening 122 outside the sensing electrodes 120. The IC stoppers can be electrically coupled to the metallization layers 110, or electrically independent of the metallization layers. Further, the IC stoppers can include a single IC stopper having a star shape. Examples of the IC stoppers are shown in FIGS. 7-10.

Figure 13:
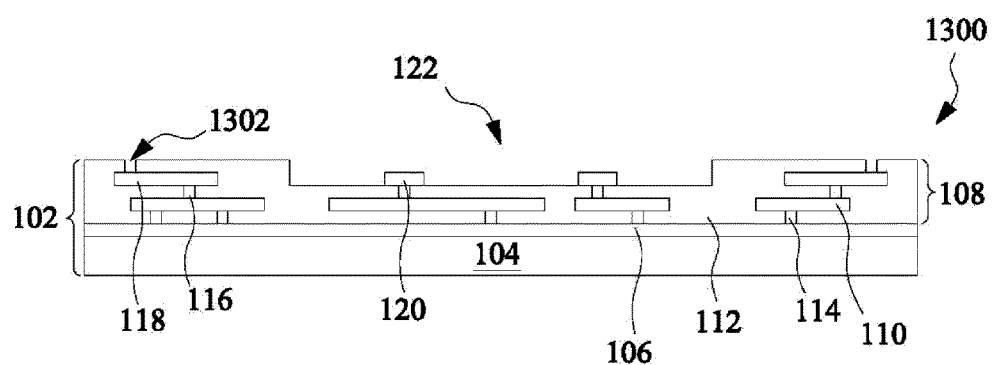

FIG. 13 illustrates a cross-sectional view 1300 of some embodiments corresponding to 1104 of FIG. 11.

As shown by FIG. 13, a first etch is performed into the ILD layer 112' to form first via openings 1302 to the IC bond pads 118. In some embodiments, the process for the first etch includes forming a first photoresist layer over the ILD layer 112', patterning the first photoresist layer to expose regions of the ILD layer 112' corresponding to the first via openings 1302, applying an etchant to the patterned first photoresist layer and the ILD layer 112', and removing the patterned first photoresist layer to expose the remaining ILD layer 112.

Figure 14:
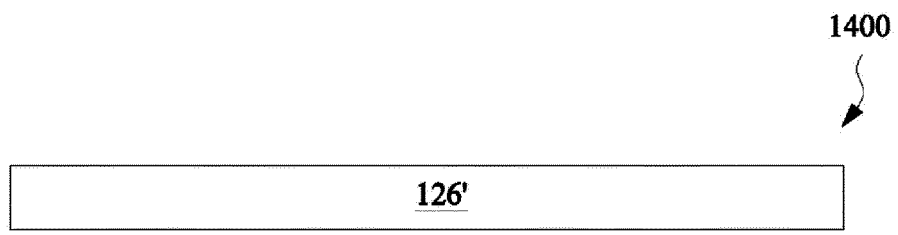

FIG. 14 illustrates a cross-sectional view 1400 of some embodiments corresponding to 1106 of FIG. 11.

As shown by FIG. 14, a MEMS substrate 126' is provided. In some embodiments, the MEMS substrate 126' is a bulk semiconductor substrate including, for example, one or more of silicon, germanium, a group III element, and a group V element. In alternative embodiments, the MEMS substrate 126' is an SOI substrate or a POI substrate.

Figure 15:
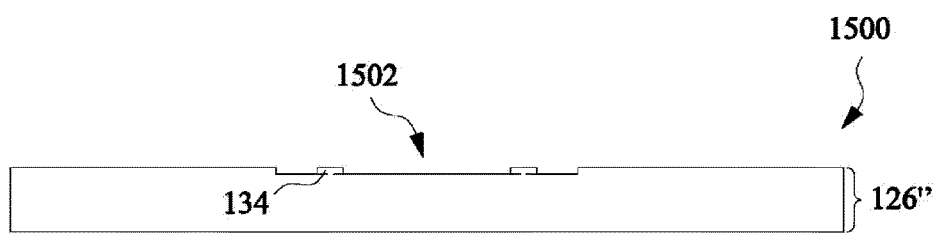

FIG. 15 illustrates a cross-sectional view 1500 of some embodiments corresponding to 1108 of FIG. 11.

As shown by FIG. 15, a second etch is performed into regions of the MEMS substrate 126' to recess a central region 1502 of the MEMS substrate 126' around stopper regions of the MEMS substrate 126'. The remaining MEMS substrate 126" has MEMS stoppers 134 corresponding to the stopper regions and integrated with the remaining MEMS substrate 126". In some embodiments, the process for the second etch includes forming a second photoresist layer over the MEMS substrate 126', patterning the second photoresist layer to expose regions of the MEMS substrate 126' corresponding to the central region 1502, applying an etchant to the patterned second photoresist layer and the MEMS substrate 126', and removing the patterned second photoresist layer to expose the remaining MEMS substrate 126".

Figure 16:
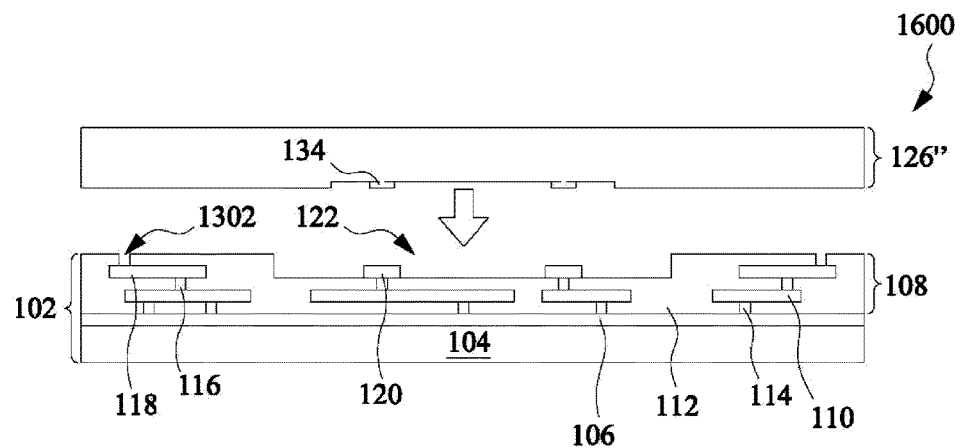

FIG. 16 illustrates a cross-sectional view 1600 of some embodiments corresponding to 1110 of FIG. 11.

As shown by FIG. 16, the remaining MEMS substrate 126" is bonded to the IC substrate 104 through the remaining ILD layer 112. Typically, the bond is formed by fusion bonding, but other approaches to bonding are amenable.

Figure 17:
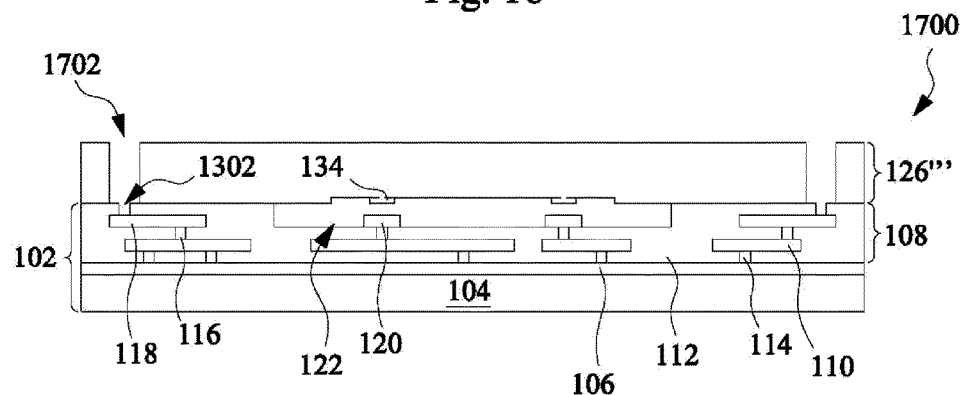
Figure 18:
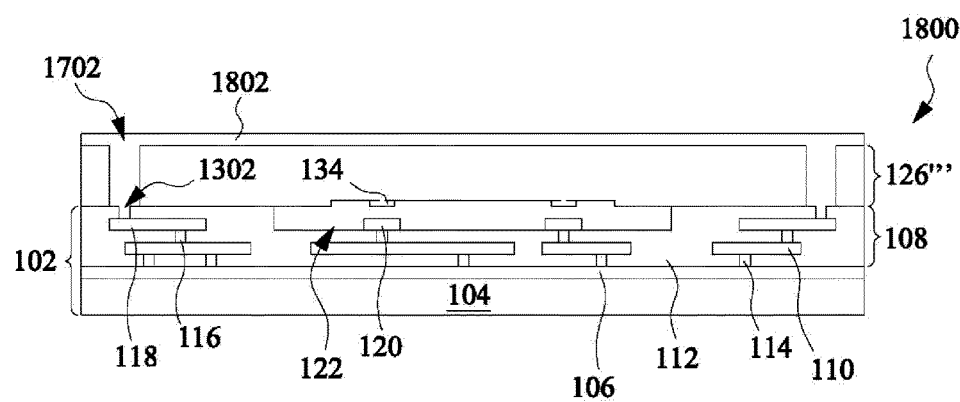
Figure 19:
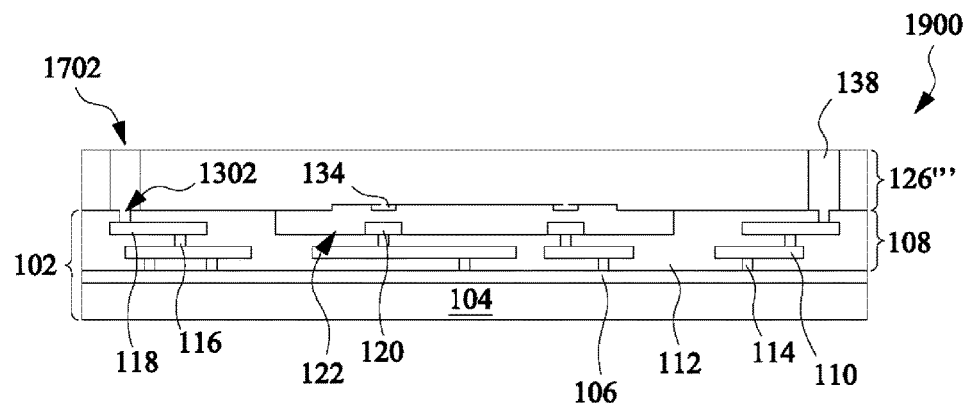

FIGS. 17-19 illustrate cross-sectional views 1700, 1800, 1900 of some embodiments corresponding to 1112 of FIG. 11.

As shown by FIG. 17, a third etch is performed into the remaining MEMS substrate 126" to form second via openings 1702 over the first via openings 1302. Typically, the second via openings 1702 are coaxially aligned with the first via openings 1302. In some embodiments, the process for the third etch includes forming a third photoresist layer over the remaining MEMS substrate 126", patterning the third photoresist layer to expose regions of the remaining MEMS substrate 126" corresponding to the second via openings 1702, applying an etchant to the patterned third photoresist layer and the remaining MEMS substrate 126", and removing the patterned third photoresist layer to expose the second via openings 1702.

As shown by FIG. 18, a first conductive layer 1802 is formed over the remaining MEMS substrate 126''' and filling the via openings 1302, 1702. The first conductive layer 1802 is or otherwise includes a conductive material, such as, for example, polysilicon or metal, such as tungsten, copper, or aluminum.

As shown by FIG. 19, a planarization and/or etch back is performed into the first conductive layer 1902 to the remaining MEMS substrate 126'''. The planarization and/or etch back results in the formation of TSVs 138 electrically coupled with the IC bond pads 118.

Figure 20:
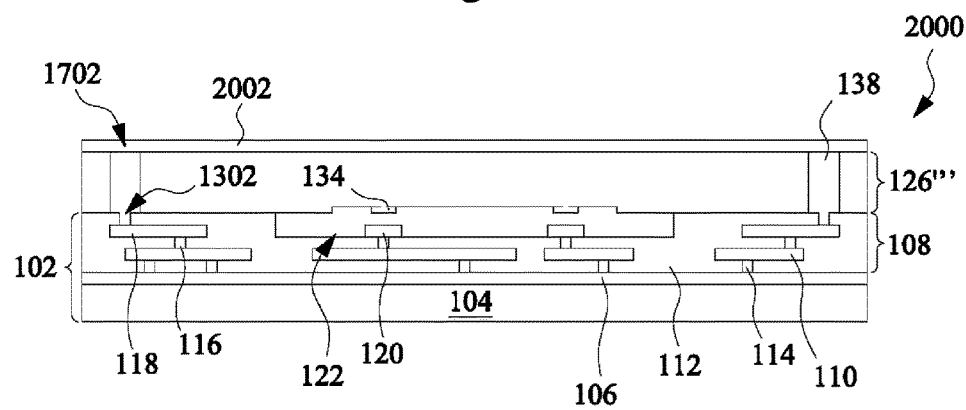
Figure 21:
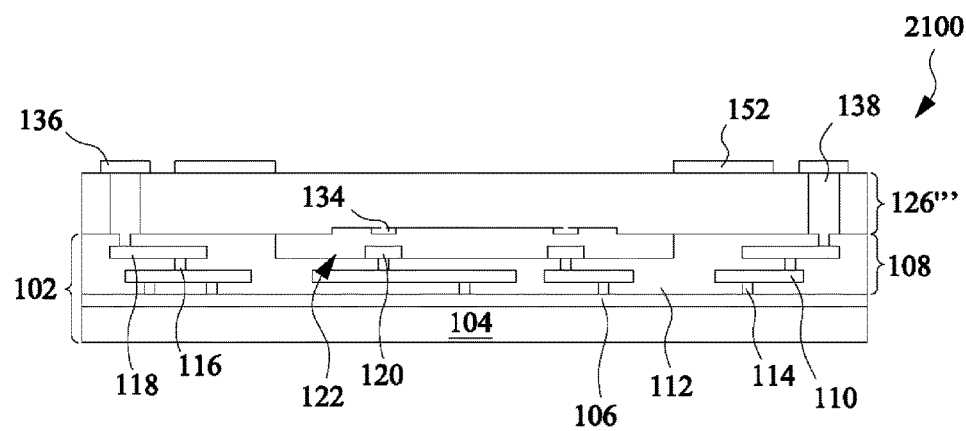

FIGS. 20 and 21 illustrate cross-sectional views 2000, 2100 of some embodiments corresponding to 1114 of FIG. 11.

As shown by FIG. 20, a second conductive layer 2002 is formed over the remaining MEMS substrate 126''' and the TSVs 138. The second conductive layer 2002 is or otherwise includes a conductive material, such as, for example, polysilicon or metal, such as tungsten, copper, or aluminum.

As shown by FIG. 21, a fourth etch is performed into the second conductive layer 2002 to form MEMS bond pads 136 over the TSVs 138, and to form a MEMS eutectic bonding ring 152 around the IC opening 122 between the MEMS bond pads 136. In some embodiments, the process for the fourth etch includes forming a fourth photoresist layer over the second conductive layer 2002, patterning the fourth photoresist layer to expose regions of the second conductive layer 2002 surrounding the MEMS bond pads 136 and the MEMS eutectic bonding ring 152, applying an etchant to the patterned fourth photoresist layer and the second conductive layer 2002, and removing the patterned fourth photoresist layer to expose the MEMS bond pads 136 and the MEMS eutectic bonding ring 152.

Figure 22:
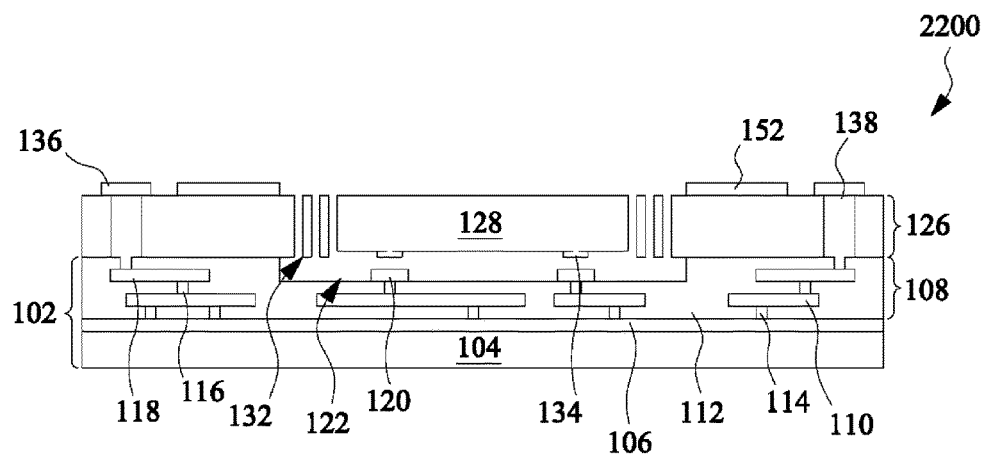

FIG. 22 illustrates a cross-sectional view 2200 of some embodiments corresponding to 1116 of FIG. 11.

As shown by FIG. 22, a fifth etch is performed into the remaining MEMS substrate 126''' to form a deflectable element 128 suspended over the IC opening 122. In some embodiments, the fifth etch also forms one or more springs 132 suspending the deflectable element 128 over the IC opening 122. Further, in some embodiments, the process for the fifth etch includes forming a fifth photoresist layer over the remaining MEMS substrate 126''', the MEMS bond pads 136, and the MEMS eutectic bonding ring 152; patterning the fifth photoresist layer to expose regions of the remaining MEMS substrate 126''' surrounding the deflectable element 128 and/or the springs 132; applying an etchant to the patterned fifth photoresist layer and the remaining MEMS substrate 126'''; and removing the patterned fifth photoresist layer to expose the deflectable element 128 and/or the springs 132.

Figure 23:
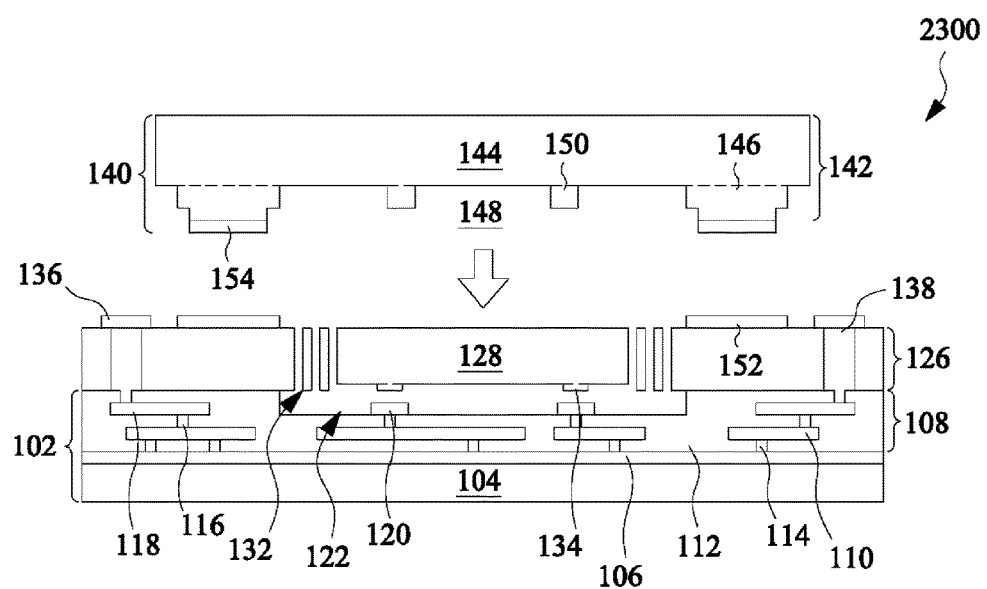

FIG. 23 illustrates a cross-sectional view 2300 of some embodiments corresponding to 1118 of FIG. 11.

As shown by FIG. 23, a cap device 140 is provided and bonded to the IC 102 through the MEMS substrate 126. A cap substrate 142 of the cap device includes a base region 144 having a generally uniform thickness and a mounting region 146 extending vertically from the base region 144 around a cap opening 148 having the approximate footprint of the IC opening 122. In some embodiments, the footprint of the mounting region 146 discretely tapers outward from the base region 144. Further, in some embodiments, the cap substrate 142 includes cap stoppers 150 extending into the cap opening 148.

A cap eutectic bonding ring 154 of the cap device 140 is arranged on a bottom surface of the mounting region 146 of the cap substrate 142 around the periphery of the cap opening 148. The MEMS and cap eutectic bonding rings 152, 154 have substantially the same footprints and interface to eutectically bond the cap device 140 to the IC 102 through the MEMS substrate 126. The cap eutectic bonding ring 154 is or otherwise includes, for example, germanium.

Thus, as can be appreciated from above, the present disclosure provides a MEMS structure. A first substrate having a dielectric layer arranged over the first substrate. The dielectric layer includes a device opening. A second substrate is arranged over and bonded to the first substrate through the dielectric layer. The second substrate includes a deflectable element arranged over the device opening. A stopper is integrated with the second substrate and protrudes from the deflectable element over the device opening.

In other embodiments, the present disclosure provides a method for manufacturing a MEMS structure. A first substrate having a dielectric layer arranged over the first substrate is provided. The dielectric layer includes a device opening. A second substrate is provided. A stopper is integrated with the second substrate. The second substrate is bonded to the first substrate through the dielectric layer. The stopper protrudes towards the first substrate from over the device opening. A deflectable element is formed in the second substrate over the device opening and the stopper.

In yet other embodiments, the present disclosure provides a MEMS structure. An IC includes a first substrate and a dielectric layer arranged over the first substrate. The dielectric layer includes a device opening. A MEMS device includes a second substrate arranged over and bonded to the first substrate through the dielectric layer. The second substrate includes a deflectable element arranged over the device opening. A stopper is integrated with the second substrate and protrudes from the deflectable element over the device opening, wherein the stopper and the second substrate are silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) structure comprising:
   a first substrate having a dielectric layer arranged over the first substrate, wherein the dielectric layer includes a device opening defined by a lower surface of the dielectric layer coupled to sidewalls of the dielectric layer;
   a metal electrode disposed within the device opening, wherein the metal electrode is arranged between bottoms and tops of the sidewalls of the dielectric layer and directly contacts the lower surface of the dielectric layer;
   a second substrate arranged over and bonded to the first substrate through the dielectric layer, the second substrate including a deflectable element and an anchor supporting the deflectable element over the device opening, wherein the second substrate is a single material;
   a stopper integrated with the second substrate and protruding from the deflectable element over the device opening, wherein a vertical sidewall of the deflectable element is arranged laterally between and spaced from the anchor and the stopper;
   a spring meandering laterally from the anchor to the vertical sidewall of the deflectable element, wherein a bottommost surface of the spring defines a serpentine path;
   wherein the bottommost surface of the spring and a bottommost surface of the stopper are arranged along a plane that intersects a sidewall of a semiconductor material of the second substrate; and
   wherein the bottommost surface of the stopper and an interface between a bottommost surface of the second substrate and a topmost surface of the dielectric layer are arranged along the plane, and wherein the bottommost surface of the stopper and the bottommost surface of the second substrate are a same material.

2. The MEMS structure according to claim 1, wherein the second substrate, the deflectable element, and the stopper include silicon.

3. The MEMS structure according to claim 1, further including:
   a third substrate including a second device opening, wherein the third substrate is arranged over and bonded to the second substrate with the second device opening over the deflectable element;
   wherein the third substrate has a cap stopper directly over the deflectable element, wherein the cap stopper comprises sidewalls protruding outward from a surface of the third substrate facing the second substrate and defining the second device opening; and
   wherein the second substrate has an upper surface facing the third substrate, and wherein a line that is perpendicular to the upper surface of the second substrate intersects the metal electrode, the stopper, and the cap stopper.

4. The MEMS structure according to claim 1, further including:
   first bond pads arranged in the dielectric layer around the device opening;
   through silicon vias (TSVs) extending through the second substrate to the first bond pads; and
   second bond pads arranged over the second substrate and electrically coupled to the first bond pads through the TSVs.

5. The MEMS structure according to claim 1, further comprising:
   an anti-stiction layer arranged along the sidewalls of the dielectric layer, sidewalls of the second substrate, and horizontal surfaces of the second substrate.

6. The MEMS structure according to claim 1, further comprising:
   a second stopper arranged in the device opening and extending towards the deflectable element, wherein the second stopper is conductive and has a bottom surface entirely contacting the dielectric layer.

7. The MEMS structure according to claim 1, wherein the interface is planar.

8. The MEMS structure according to claim 6, further comprising:
   a pair of sensing electrodes arranged directly under the deflectable element; and
   a third stopper arranged in the device opening and extending towards the deflectable element, wherein the third stopper is conductive and has a bottom surface entirely contacting the dielectric layer;
   wherein the stopper is laterally spaced between the pair of sensing electrodes, and wherein the pair of sensing electrodes are laterally spaced between the second and third stoppers.

9. The MEMS structure according to claim 1, further comprising:
   a eutectic bonding ring arranged over the second substrate and laterally enclosing the device opening; and
   a third substrate arranged over and eutectically bonded to the second substrate through the eutectic bonding ring, wherein a planar top surface of the second substrate is continuous from the eutectic bonding ring to a vertical sidewall of the anchor, wherein the spring extend laterally from the vertical sidewall of the anchor to the vertical sidewall of the deflectable element.

10. The MEMS structure according to claim 1, wherein a topmost surface of the second substrate covers the bottommost surface of the stopper and a recessed surface of the second substrate, wherein the recessed surface is vertically spaced between the topmost surface of the second substrate and the bottommost surface of the second substrate, and wherein the stopper protrudes downward from the recessed surface to culminate at the bottommost surface of the stopper.

11. The MEMS structure according to claim 1, wherein the plane further intersects the sidewalls of the dielectric layer.

12. A method for manufacturing a microelectromechanical systems (MEMS) structure, the method comprising:
   providing a first substrate having a dielectric layer arranged over the first substrate and surrounding a metal electrode;
   forming a device opening within the dielectric layer, which is defined by a lower surface of the dielectric layer coupled between sidewalls of the dielectric layer, wherein the metal electrode is arranged between bottoms and tops of the sidewalls of the dielectric layer and directly contacts the lower surface of the dielectric layer;

providing a second substrate, wherein the second substrate is a bulk semiconductor substrate of a single semiconductor material;

performing an etch into the second substrate to remove some of the single semiconductor material and to form a plurality of stoppers, wherein the plurality of stoppers are integrated with the second substrate and are formed of the single semiconductor material;

bonding the second substrate to the first substrate through the dielectric layer after forming the device opening, so that the plurality of stoppers protrude from the second substrate towards the device opening;

forming a deflectable element in the second substrate over the device opening and the plurality of stoppers; and forming a spring in the second substrate, the spring supporting the deflectable element over the device opening.

13. The method according to claim 12, further including:
providing a third substrate having a second device opening;
bonding the third substrate over the second substrate with the second device opening over the deflectable element;
wherein the third substrate has a cap stopper directly over the deflectable element, wherein the cap stopper comprises sidewalls protruding outward from a surface of the third substrate facing the second substrate and defining the second device opening; and
wherein the second substrate has an upper surface facing the third substrate, and wherein a line that is perpendicular to the upper surface of the second substrate intersects the metal electrode, the stopper, and the cap stopper.

14. The method according to claim 12, further including:
providing first bond pads arranged in the dielectric layer around the device opening;
forming through silicon vias (TSVs) extending through the second substrate to the first bond pads; and
forming second bond pads over the second substrate and electrically coupled to the first bond pads through the TSVs.

15. The method according to claim 12, further including:
forming the plurality of stoppers at positions laterally offset from the metal electrode, wherein the metal electrode is arranged laterally between two of the plurality of stoppers.

16. The method according to claim 12, wherein forming the deflectable element and the spring comprises performing a second etch into the second substrate to form the spring and the deflectable element, wherein the spring is formed extending laterally from a sidewall of the second substrate to a sidewall of the deflectable element that is laterally spaced from the stopper and that opposes the sidewall of the second substrate.

17. The method according to claim 12, wherein the bonding is performed after forming the stopper.

18. The method according to claim 12, wherein performing the etch comprises:
forming a mask covering a peripheral region of the second substrate that laterally encloses a central region of the second substrate, and further covering a stopper region of the second substrate, wherein the stopper region is in the central region; and
applying an etchant to the second substrate with the mask in place to remove some of the single semiconductor material from the second substrate, thereby recessing the central region of the second substrate relative to the peripheral and stopper regions of the second substrate.

19. The method according to claim 12, further including:
forming a sensing electrode in the device opening, wherein the sensing electrode is formed contacting the dielectric layer and with a star-shaped pattern.

20. A microelectromechanical systems (MEMS) structure comprising:
an integrated circuit (IC) including a first substrate and a dielectric layer arranged over the first substrate, wherein the dielectric layer includes a device opening;
a MEMS device including a second substrate arranged over and bonded to the first substrate through the dielectric layer, the second substrate including a deflectable element suspended over the device opening by a spring that has a bottommost surface facing the dielectric layer, wherein the bottommost surface of the spring defines a serpentine path between an anchor overlying the dielectric layer and a sidewall of the deflectable element;
a stopper integrated with the second substrate and protruding from the deflectable element over the device opening, wherein the stopper and the deflectable element are silicon and have the same crystalline structure, wherein the stopper is laterally spaced from the sidewall of the deflectable element; and
wherein a bottommost surface of the stopper and the bottommost surface of the spring are arranged along a plane that intersects a sidewall of a semiconductor material of the second substrate.

* * * * *